United States Patent
Lee et al.

(10) Patent No.: US 6,716,563 B2
(45) Date of Patent: Apr. 6, 2004

(54) AZO DYES AND AZO-METAL COMPLEXES FOR ATOMIC FORCE MICROSCOPE LITHOGRAPHY

(75) Inventors: Haiwon Lee, Seongnam-shi (KR); Hyeyoung Park, Seongnam-shi (KR)

(73) Assignee: Hanyang Hakwon Co., Ltd., Seoul (KR)

( * ) Notice: Subject to any disclaimer, the term of this patent is extended or adjusted under 35 U.S.C. 154(b) by 0 days.

(21) Appl. No.: 10/214,192

(22) Filed: Aug. 8, 2002

(65) Prior Publication Data

US 2003/0045122 A1 Mar. 6, 2003

(30) Foreign Application Priority Data

Aug. 9, 2001 (KR) ......................................... 2001-48108

(51) Int. Cl.$^7$ .............................................. H01L 21/31
(52) U.S. Cl. ..................... 430/146; 430/171; 430/561; 534/558; 534/683; 438/780; 438/782
(58) Field of Search .................................. 430/146, 171, 430/343, 561; 534/558, 683; 438/780, 782

(56) References Cited

U.S. PATENT DOCUMENTS

| | | | | | |
|---|---|---|---|---|---|
| 4,601,969 | A | * | 7/1986 | Clecak et al. | 430/192 |
| 6,143,460 | A | * | 11/2000 | Kobayashi | 430/170 |
| 6,403,277 | B1 | * | 6/2002 | Sweet et al. | 430/146 |
| 6,413,607 | B1 | * | 7/2002 | Kasada et al. | 428/64.1 |
| 6,451,497 | B1 | * | 9/2002 | Kunita | 430/191 |
| 6,548,234 | B2 | * | 4/2003 | Gibson | 430/384 |
| 6,617,186 | B2 | * | 9/2003 | Kashiwabara | 438/29 |

* cited by examiner

*Primary Examiner*—Alexander Ghyka
(74) *Attorney, Agent, or Firm*—Finnegan, Henderson, Farabow, Garrett & Dunner, LLP

(57) ABSTRACT

This invention relates to nano-lithography with π-conjugated azo dyes and azo-metal complexes represented by formula 1 or formula 2(Korea Pat. Appln. Nos. 2001-6879~6880), which has both electron-donating and electron-accepting groups in the molecular structures, as a resist on Si substrate by using an AFM anodization. lithography. Developing optimum conditions of scan speed, bias voltage, and resist materials are key issues for achieving a high resolution patterning on various substrates. We accomplished nanometer-scale patterning in approximately 35 nm dimensions.

7 Claims, 2 Drawing Sheets

AZO DYES AND AZO-METAL COMPLEXES FOR ATOMIC FORCE MICROSCOPE LITHOGRAPHY

BACKGROUND OF THE INVENTION

1. Field of the Invention

The present invention relates to azo dyes and azo-metal complexes for atomic force microscope (AFM) lithography, and more specifically to π-conjugated azo dyes and azo-metal complexes having both electron-donating and electron-accepting groups within molecules, so that fine patterns of nanometer-scale order can be formed on silicon and metal substrates by AFM.

2. Description of the Prior Art

The trend of downsizing has been in rapid progress in the field of electronic engineering. This trend is easily identified in data processing, communication and various appliance industries. From the view of IT (information technology) industry, it can be said that an era of sub-micro technology has come passing the era of micro technology. With this downsizing trend, the optical micro-processing technology in microelectronics enabled ultra-integration up to 0.1 μm of line-width in 1996 since the appearance of 4K DRAM in the 1970s.

Because excimer laser, X-ray, electron beam and focused ion beam technologies are expected to be the micro-processing that enables the sub-micrometer resolution technology, the advanced countries are strategically developing these next-generation micro-processing technologies.

As the electron beam micro-processing technology is emerging as a powerful tool for processing ultra-micro devices of below 0.1 μm order, a new type of ideal molecular film resist, which can overcome the limit of the conventional photoresist, is required. Currently, the electron beam resist is widely used in production of masks for micro processing. But, it is not directly used in processing semiconductor devices. However, with the development of ultramicro-processing equipments and improvement of resist capacities, the probability of using electron beam resist is on the increase. Therefore, we carried out basic researches on ultramicro pattern forming using AFM, which is emerging as a new micro-processing technology.

Generally, atomic force microscope is used in morphology study of solid sample surfaces without damaging it. Nanolithography is recognized as a powerful method to visualize the fabrication of nanoelectronic devices these days. Among several techniques, lithographic methods using AFM are promising techniques to produce nano-sized patterns. One of them is AFM anodization lithography based on an electrochemical reaction on the surface of metal or semiconductor.

This technique can be used to control materials at nano level, by producing artificial nano structures. Currently, the level of below 30 nm cannot be easily accessed by the conventional techniques including the e-beam lithography, and AFM can be said as an unparalleled technique in this field.

In the nano lithography using AFM, a variety of methods, including ultramicro pattern formation using resist material and oxide pattern formation on hydrogen passivated Si-wafer or poly-Si surface by applying electric field using AFM tip, are being carried out. Also, this technique can be applied to the next-generation data storage system when combined with electrostatic force microscopy (EFM) and scanning capacitance microscopy (SCM).

In most conventional AFM lithography techniques, the pattern formation was carried out by preparing self-assembled monolayer film using organic resist (*Jpn. J. Appl. Phys.*, 37, 7148, Kim J. C.; *J. Kor. Phys. Soc.*, 35, 1013, 1999, Kim, J. C.; *Adv. Mater.*, 12, 6, 424, 2000, Rivka M.). However, because the chemical bonding of the molecules to the substrate, it is rather difficult to remove the molecular film completely. Because the present invention forms the film by spin coating rather than chemical bonding, a thin and uniform film is obtained and it can be easily removed after patterning.

Important factors in the AFM lithography are applied voltage, current, scanning speed, humidity and physical properties of resist, etc. (*J. Appl. Phys. Lett.*, 2592, 2002, Sang Jung A.; *Vac. Sci. Technol.*, 1223, 1996, Sugimura, A.; *J. Vac. Sci. Technol.*, 2912, 1997, Birkelund K.; *J. Appl. Phys. Lett.*, 285, 1997, Avouris P.).

If the processing condition is improper, the line-width becomes non-uniform and the line can be broken during patterning. Therefore, development of high-performance resist and proper control of applied voltage, scanning speed and humidity are required for better pattern formation.

In the present invention, ultra-thin resist of sub-nanometer order is formed on the substrate using a spin coater, and a pattern with minimum line-width smaller than 35 nm is prepared. If this resist material is used in the optimum processing condition, ultra-micro pattern of nanometer order can be obtained. This technique can be a very important basic technique in the development of proto-type terabit semiconductor memory devices in the near future.

SUMMARY OF THE INVENTION

The present invention forms thin film of π-conjugated organic materials having both electron-donating and electron-accepting groups on the metal substrate, not by chemical bonding but by spin coating. Therefore, a thin and uniform film is obtained and it can be easily removed after patterning. The resist material of the present invention can be used in ultra-thin film patterning using AFM lithography at the optimum condition. This technique can be a very important basic technique in the development of proto-type terabit semiconductor memory devices.

DETAILED DESCRIPTION OF THE INVENTION

Figure 1:
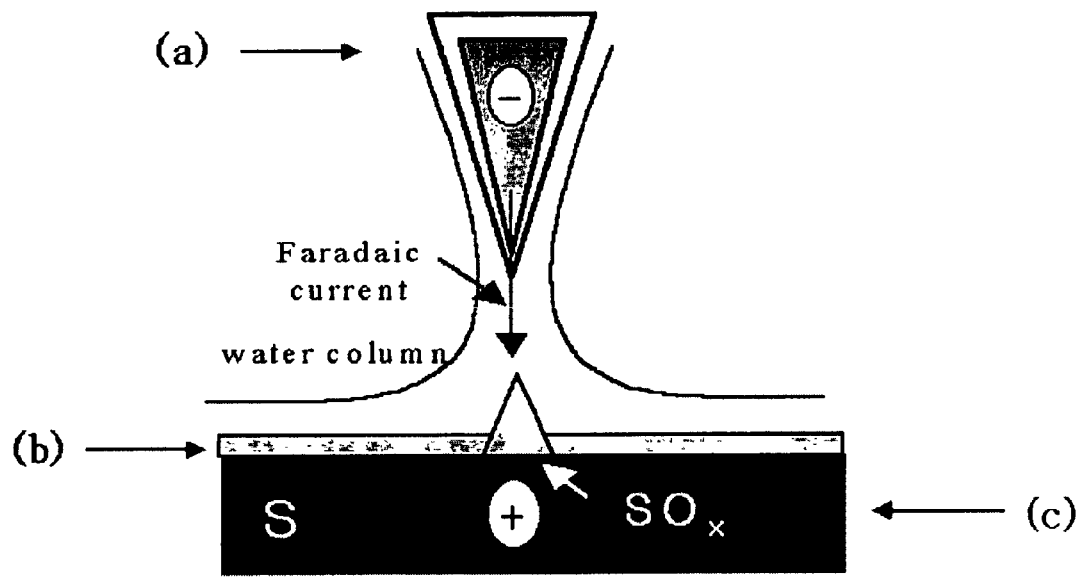
FIG. 1 is a schematic of AFM lithography according to the present invention: (a) is the AFM tip where a cathode reaction takes place; (b) is the film layer of BA-A or MBT-A-Ni; and (c) is the semiconductor or metal substrate where anode reaction takes place.

The present invention is characterized by azo dyes and azo-metal complexes for AFM lithography represented by the following formulas 1 & 2,

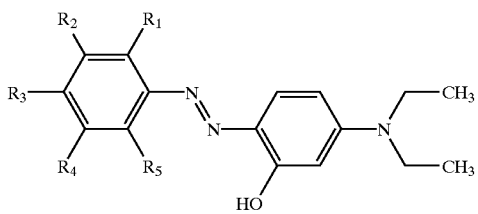

(1)

wherein $R_1$, $R_2$, $R_3$, $R_4$ and $R_5$ are independently a hydrogen atom, a halogen atom, a $C_1$–$C_6$ alkyl group, a $C_1$–$C_6$ alkoxy group, a carboxyl group, a nitro group, a hydroxy group, a cyano group, a phenyl group or a sulfonic acid group; and $R_4$ and $R_5$ may form a benzene ring, a naphthalene ring or an anthracene ring; and (2)

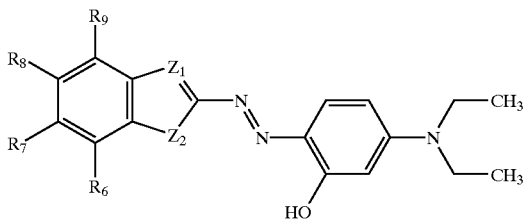

wherein $Z_1$ and $Z_2$ are S, N or O; and $R_6$, $R_7$, $R_8$ and $R_9$ are independently a hydrogen atom, a halogen atom, a $C_1$–$C_6$ alkyl group, a $C_1$–$C_6$ alkoxy group, a carboxyl group, a nitro group, a hydroxy group, a cyano group, a phenyl group or a sulfonic acid group.

Hereunder is given a more detailed description of the present invention.

The present invention relates to azo compounds for AFM lithography. Because π-conjugated azo dyes or azo-metal complexes represented by formula 1 or formula 2 have both electron-donating and electron-accepting groups, they can form uniform and narrow line-widths. Also, they can act as stable resists because they have superior heat stability. And, because the resist composition comprising these azo compounds can be applied on metal substrate by spin coating rather than chemical bonding in order to obtain a thin and uniform ultra-thin film and fine pattern of nanometer order, it can be easily removed after patterning.

Azo dyes and azo-metal complexes of the present invention are novel compounds that we invented. We filed applications for patents on these compounds (Korea Pat. Appln. Nos. 2001-6879 & 2001-6880). They can be represented by the following formulas.

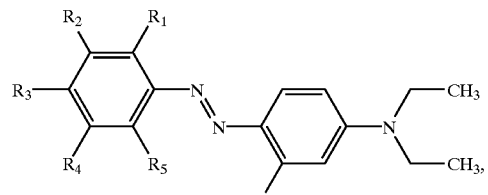

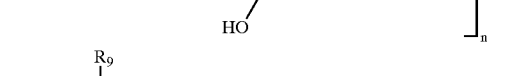

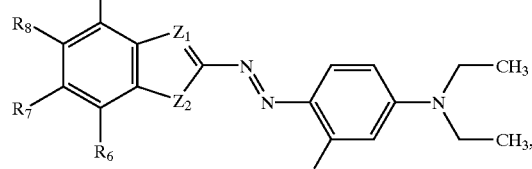

The metal (M) that forms complexes with the azo compounds expressed by formula 1 or formula 2 can be selected from Ni, Zn, Co, Cu, Fe, Pt, Pb or Ag. Among these, Ni is preferred.

The specific method for applying azo dyes or azo-metal complexes represented by formula 1 or formula 2 to the AFM lithography is as follows.

After dissolving the azo compounds in a solvent, constituents conventionally used in preparing resist composition are added to prepare a resist composition. The content of the azo compounds in the resist composition is about 2–20 wt % of the total composition, and preferably 5–15 wt %. For the solvent, one or more selected from ketone, halogenated hydrocarbon, aromatic hydrocarbon, aliphatic alcohol, halogenated aliphatic alcohol, aliphatic ester and glycol ether can be used. The content of the solvent in the resist composition is about 50–90 wt % of the total composition, and preferably 60–80 wt %. The constituents added to the resist composition can be selected from surfactant, pigment, retardant, accelerator and adhesion promoter. Their contents can be determined as required.

The substrate to form thin film using the resist composition is dipped in 3:1 mixture solution of sulfuric acid and hydrogen peroxide for 30 min and washed several times with deionized water. For the substrate, common material such as Si, GaAs, Cr, Ti and Mn can be used. Among these, silicon (Si) substrate is preferable.

The resist composition is applied on this prepared substrate by any known coating methods known in the art. Such coating methods include spin coating, spray coating, dip coating and roller coating. Among these methods, spin coating is preferred. Film formation by spin coating is performed as follows. The prepared resist composition is spun at 2000–3000 rpm for 20–40 s using a spin coater substrate to form thin film on the substrate. Then, the substrate is thermally treated at 70–80° C. for 1–2 min to remove solvent remaining in the film and enhance adhesiveness of the resist. The thickness of the obtained film was about 1–2 nm, and its average surface roughness observed by AFM was 0.5–1.0 Å/9 $\mu m^2$.

AFM lithography was carried out for the substrate on which azo compounds expressed by Formulas 1, 2 & 3 are applied. Here, control of applied voltage on the AFM, scanning speed, humidity, etc. plays an important role in obtaining narrow line-widths. In the present invention: voltage applied to the AFM tip was 7–15 V; humidity was 40–70%; and spacing of 1 $\mu m$ lines were drawn on 5×5 $\mu m$ of surface at 1–100 $\mu m/s$ speed. As a result, a pattern with 35–75 nm of line-width was obtained.

The following examples and preparing example are to be illustrative of the present invention. However, they should not be construed as limiting the scope of this invention.

PREPARING EXAMPLE 1

4-[(4-Diethylamino-hydroxyphenyl)-1-diazenyl]-benzoic Acid (BA-A)

2.74 g (0.02 mol) of aminobenzoic acid was dissolved in 17 mL of sulfuric acid at 0° C. Then, the temperature was lowered to −20° C. 3.8 g of $HO_3SONO$ was slowly added to this solution, and the mixture solution was stirred for 2 hr. When a yellow solid was produced, 3.30 g (0.02 mol) of diethylaminophenol expressed by Formula 4 was added to the solution to couple it. The solution was stirred for 20 min, and then 10 mL of ice water was added. This solution was stirred for 30 min and neutralized to pH 6. When a reddish brown solid was produced, the solution was filtered by suction and re-precipitated using alcohol. Then, it was vacuum-dried at 50° C. Maximum absorption wavelength $(\lambda_{max})$=427 nm; heat stability temperature=240° C.; $^1H$ NMR ($CDCl_3$, ppm) δ1.17 (t, 3H), 3.35–3.59 (m, 2H), 5.98 (s, 1H), 6.4 (d, 1H), 7.4 (d, 1H), 7.85 (d, 1H), 8.15 (d, 1H)

PREPARING EXAMPLE 2

4-((E)-2-Amino-6-methoxybenzothiazole)-azo (MBT-A)

2.3 g (0.01 mol) of aminomethoxybenzothiazole expressed by Formula 6 was dissolved in 8.82 g of sulfuric acid at 0° C. Then, the temperature was lowered to −20° C. 0.83 g (0.012 mol) of sodium nitrite dissolved in small amount of water was slowly added to this solution, and the mixture solution was stirred for 20 min. When a yellow solid was produced, 1.65 g (0.01 mol) of diethylaminophenol (Formula 4) dissolved in methanol was added to couple the solution. The solution was stirred for 30 min, and then 10 mL of ice water was added. This solution was stirred for 30 min and neutralized to pH 7. When a reddish brown solid was produced, the solution was filtered by suction and re-precipitated using alcohol. Then, it was vacuum-dried at 50° C. Maximum absorption wavelength $(\lambda_{max})$=516 nm; heat stability temperature=243° C.; $^1H$ NMR ($CDCl_3$, ppm) δ1.17 (t, 3H), 3.35–3.59 (m, 2H), 6.15 (s, 1H), 6.42 (d, 1H), 7.1 (d, 1H), 7.5 (d, 1H), 7.82 (d, 1H), 8.28 (s, 1H).

PREPARING EXAMPLE 3

4-((E)-2-Amino-6-methoxybenzothiazole)-azo Nickel Complex (MBT-A-Ni)

1.1 g of MBT-A prepared in Preparing Example 2 was dissolved in 15 mL of methanol. 1.49 g of NiAc (nickel acetate).$4H_2O$ dissolved in 4 mL of methanol was slowly added to this solution. After 3 hr of stirring, 20 mL of water was added. When a solid was produced, the solution was filtered by suction and vacuum-dried at 70° C. Maximum absorption wavelength $(\lambda_{max})$=541 nm; heat stability temperature=292° C.

EXAMPLE 1

0.05 g of BA-A prepared in Preparing Example 1 was dissolved in 40 g of tetrafluoropropanol. Silicon substrate to form thin film was dipped in 3:1 mixture solution of sulfuric acid and hydrogen peroxide for 30 min and washed several times with deionized water. The prepared solution was spun at 2000 rpm for 30 s using a spin coater to obtain thin film on the clean silicon substrate. Then, the substrate was thermally treated at 80° C. for 1 min. Thickness of the film measured with an ellipsometer was 1 nm. Its average surface roughness observed by AFM was 0.54 Å/9 $\mu m^2$. AFM lithography was carried out using this substrate. Voltage applied to the AFM tip was 10 V; humidity was 50%; and spacing of 1 $\mu m$ lines were drawn on 5×5 $\mu m$ of surface at the scanning speed of 10 $\mu m/s$. When voltage is applied to the film surface, the BA-A layer is destroyed and $SiO_x$ is projected by the mechanism expressed by Equation 1, and uniform lines are formed.

Equation 1

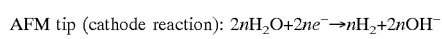

AFM tip (cathode reaction): $2nH_2O + 2ne^- \rightarrow nH_2 + 2nOH^-$

Substrate (anode reaction): $Si + nH_2O \rightarrow SiO_n + 2nH^+ + 2ne^-$

Figure 2:
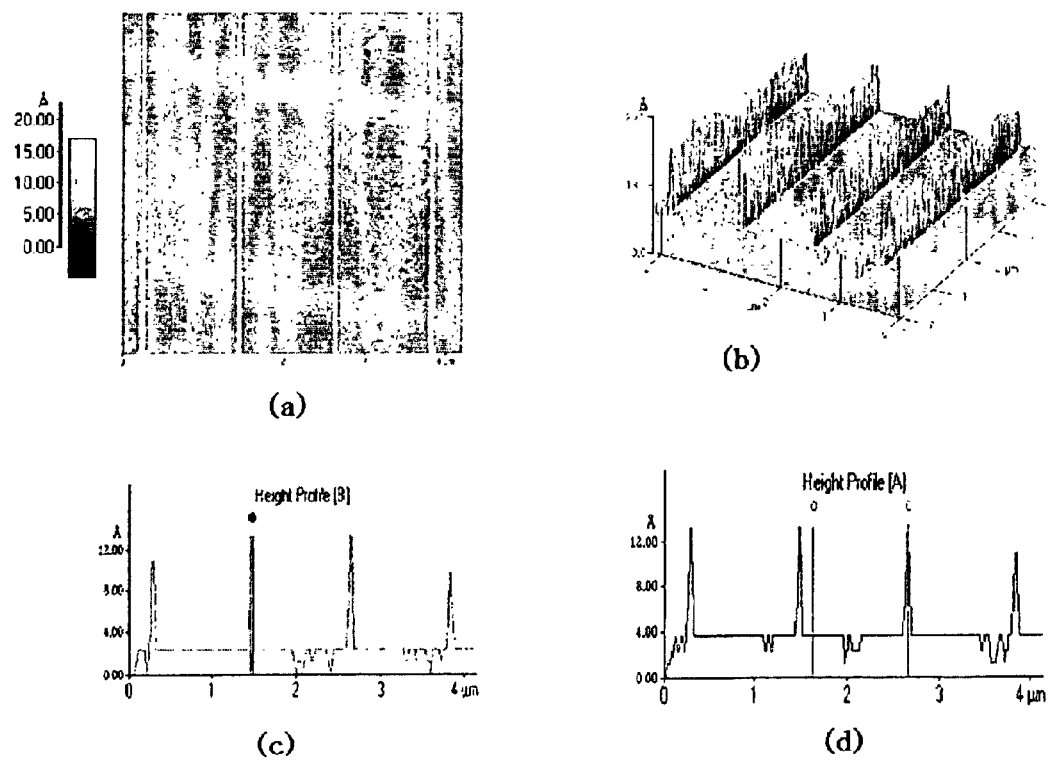
FIG. 2 is an AFM image of the pattern formed by AFM lithography, after forming a film on silicon substrate using 4-[(4-diethylamino-2-hydroxyphenyl)-1-diazenyl]-benzoic acid (BA-A) prepared in Preparing Example 1: (a) is a two-dimensional view which shows projected $SiO_x$; (b) is a three-dimensional view of (a); (c) is a graph that shows line-width of the pattern (a), which being 35 nm; and (d) is a graph that shows height of the pattern (a), which being 10 Å.

FIG. 2 is a schematic of the AFM lithography of the present invention. When voltage is applied to the thin film using an AFM tip, the surface is destroyed and Si reacts with moisture in the air to produce $SiO_x$, thereby forming uniform lines [J. Vac. Sci. Technol. A 14, 3, 1996, 1223, Hiroyuki, S.]. The linewidth of projected $SiO_x$ was 35 nm and its height was 10 Å.

EXAMPLE 2

0.01 g of MBT-A prepared in Preparing Example 2 was dissolved in 50 g of tetrafluoropropanol. Silicon substrate to form thin film was dipped in 3:1 mixture solution of sulfuric acid and hydrogen peroxide for 30 min and washed several times with deionized water. The prepared solution was spun at 2000 rpm for 30 s using a spin coater to obtain thin film on the clean silicon substrate. Then, the substrate was thermally treated at 80° C. for 1 min. Thickness of the film measured with an ellipsometer was 1 nm. Its average surface roughness observed by AFM was 0.62 Å/9 $\mu m^2$. AFM lithography was carried out using this substrate. Voltage applied to the AFM tip was 10 V; humidity was 50%; and spacing of 1 $\mu m$ lines were drawn on 5×5 $\mu m$ of surface at the scanning speed of 10 $\mu m/s$. When voltage is applied to the film surface, the MBT-A layer is destroyed and $SiO_x$ is projected by the mechanism expressed by Equation 1, and uniform lines are formed.

Figure 3:
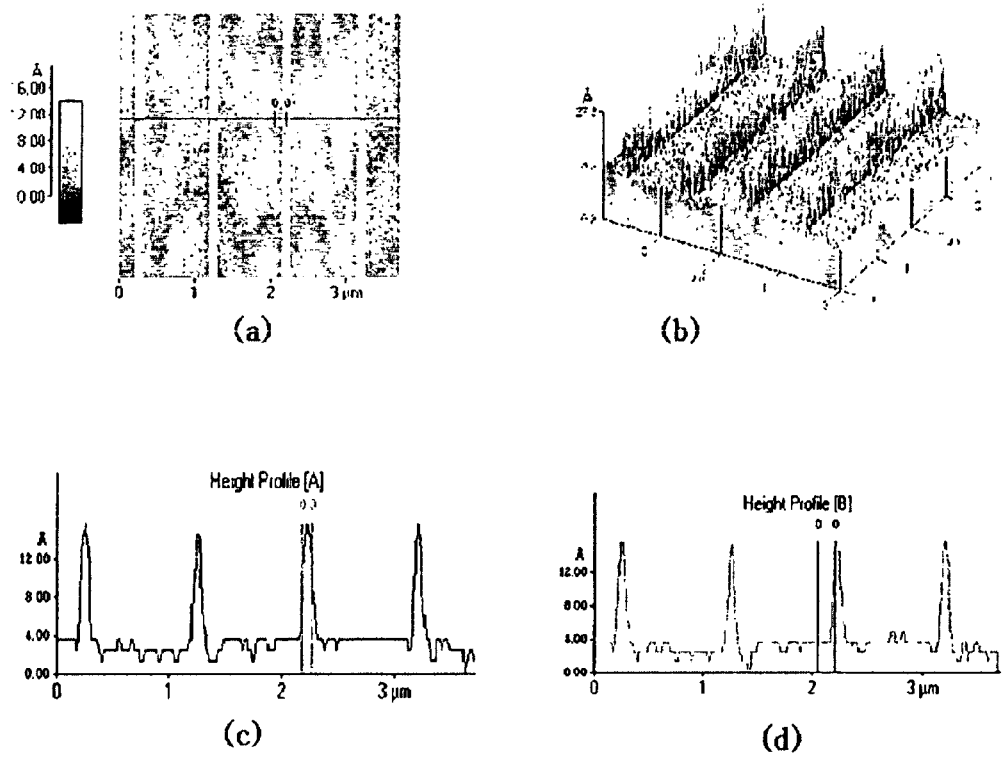
FIG. 3 is an AFM image of the pattern formed by AFM lithography, after forming a film on silicon substrate using 4-((E)-2-amino-6-methoxybenzothiazole)-azo (MBT-A) prepared in Preparing Example 2: (a) is a two-dimensional view which shows projected $SiO_x$; (b) is a three-dimensional view of (a); (c) is a graph that shows line-width of the pattern (a), which being 73 nm; and (d) is a graph that shows height of the pattern (a), which being 12 Å.

FIG. 3 is a schematic of the AFM lithography of the present invention. When voltage is applied to the thin film using an AFM tip, the surface is destroyed and Si reacts with moisture in the air to produce $SiO_x$, thereby forming uniform lines [J. Vac. Sci. Technol. A 14, 3, 1996, 1223, Hiroyuki, S.]. The line-width of projected $SiO_x$ was 73 nm and its height was 12 Å.

EXAMPLE 3

0.01 g of MBT-A-Ni prepared in Preparing Example 3 was dissolved in 50 g of tetrafluoropropanol. Silicon substrate to form thin film was dipped in 3:1 mixture solution of sulfuric acid and hydrogen peroxide for 30 min and washed several times with deionized water. The prepared solution was spun at 2000 rpm for 30 s using a spin coater to obtain thin film on the clean silicon substrate. Then, the substrate was thermally treated at 80° C. for 1 min. Thickness of the film measured with an ellipsometer was 1 nm. Its average surface roughness observed by AFM was 0.67 Å/9 $\mu m^2$. AFM lithography was carried out using this substrate. Voltage applied to the AFM tip was 10 V; humidity was 50%; and spacing of 1 $\mu$m lines were drawn on 5×5 $\mu$m of surface at the scanning speed of 10 $\mu$m/s. When voltage is applied to the film surface, the MBT-A-Ni layer is destroyed and $SiO_x$ is projected by the mechanism expressed by Equation 1, and uniform lines are formed.

Figure 4:
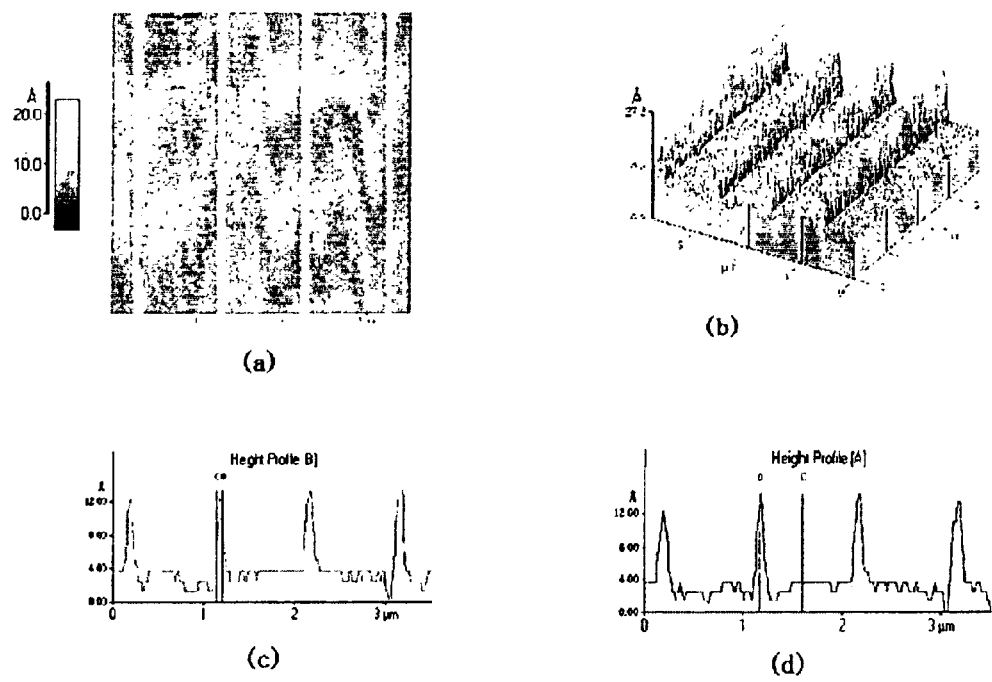
FIG. 4 is an AFM image of the pattern formed by AFM lithography, after forming a film on silicon substrate using 4-((E)-2-amino-6-methoxybenzothiazole)-azo nickel complex (MBT-A-Ni) prepared in Preparing Example 3: (a) is a two-dimensional view which shows protruded $SiO_x$; (b) is a three-dimensional view of (a); (c) is a graph that shows line-width of the pattern (a), which being 75 nm; and (d) is a graph that shows height of the pattern (a), which being 10 Å.

FIG. 4 is a schematic of the AFM lithography of the present invention. When voltage is applied to the thin film using an AFM tip, the surface is destroyed and Si reacts with moisture in the air to produce $SiO_x$, thereby forming uniform lines [*J. Vac. Sci. Technol.* A 14, 3, 1996, 1223, Hiroyuki, S.]. The line-width of projected $SiO_x$ was 75 nm and its height was 10 Å.

As explained above, fine pattern of nanometer order was formed on the metal substrate using π-conjugated azo dyes or azo-metal complexes expressed by Formula 1 or Formula 2, having both electron-donating and electron accepting groups. Accordingly, the present invention can be a very important basic technique in mass media field, which requires terabit semiconductor memory devices and ultra-thin pattern formation techniques.

What is claimed is:

1. Azo dyes or azo-metal complexes for AFM lithography represented by the following formula 1

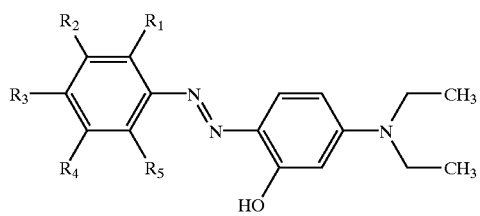
(1)

wherein $R_1$, $R_2$, $R_3$, $R_4$ and $R_5$ are independently a hydrogen atom, a halogen atom, a $C_1$–$C_6$ alkyl group, a $C_1$–$C_6$ alkoxy group, a carboxyl group, a nitro group, a hydroxy group, a cyano group, a phenyl group or a sulfonic acid group; and $R_4$ and $R_5$ may form a benzene ring, a naphthalene ring or an anthracene ring.

2. Azo compounds for AFM lithography according to claim 1, wherein the metal for forming the metal complexes is selected from Ni, Zn, Co, Cu, Fe, Pt, Pb or Ag.

3. Azo dyes or azo-metal complexes for AFM lithography, which are expressed by formula 2

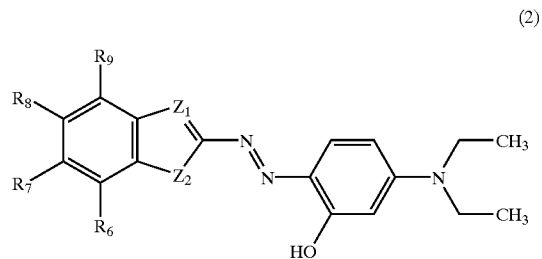
(2)

wherein $Z_1$ and $Z_2$ are S, N or O; and $R_6$, $R_7$, $R_8$ and $R_9$ are independently a hydrogen atom, a halogen atom, a $C_1$–$C_6$ alkyl group, a $C_1$–$C_6$ alkoxy group, a carboxyl group, a nitro group, a hydroxy group, a cyano group, a phenyl group or a sulfonic acid group.

4. Azo compounds for AFM lithography according to claim 3, wherein the metal for forming the metal complexes is selected from Ni, Zn, Co, Cu, Fe, Pt, Pb or Ag.

5. AFM lithography method performed at 7–15V of voltage, 40–70% of humidity and 1–100 $\mu$m/s of speed for resist composition, comprising azo compounds or azo-metal complexes represented by the following formula 1 or formula 2, spin-coated on metal and semiconductor substrates.

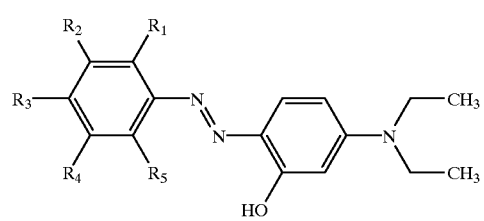
(1)

wherein $R_1$, $R_2$, $R_3$, $R_4$ and $R_5$ are independently a hydrogen atom, a halogen atom, a $C_1$–$C_6$ alkyl group, a $C_1$–$C_6$ alkoxy group, a carboxyl group, a nitro group, a hydroxy group, a cyano group, a phenyl group or a sulfonic acid group; and $R_4$ and $R_5$ may form a benzene ring, a naphthalene ring or an anthracene ring; and

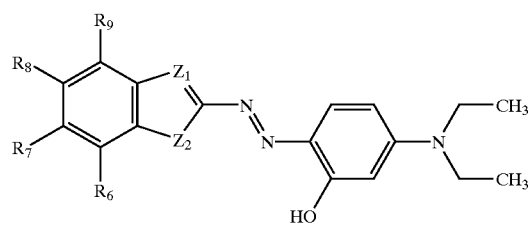
(2)

wherein $Z_1$ and $Z_2$ are S, N or O; and $R_6$, $R_7$, $R_8$ and $R_9$ are independently a hydrogen atom, a halogen atom, a $C_1$–$C_6$ alkyl group, a $C_1$–$C_6$ alkoxy group, a carboxyl group, a nitro group, a hydroxy group, a cyano group, a phenyl group or a sulfonic acid group.

6. AFM lithography method according to claim 5, wherein the metal for forming the metal complexes is selected from Ni, Zn, Co, Cu, Fe, Pt, Pb or Ag.

7. AFM lithography method according to claim 5, wherein the substrates are made of Si, GaAs, Cr, Ti or Mn.

* * * * *

UNITED STATES PATENT AND TRADEMARK OFFICE
CERTIFICATE OF CORRECTION

PATENT NO. : 6,716,563 B2
APPLICATION NO. : 10/214192
DATED : April 6, 2004
INVENTOR(S) : Halwon Lee et al.

It is certified that error appears in the above-identified patent and that said Letters Patent is hereby corrected as shown below:

In claim 5, column 8, line 24, "substrates." should read --substrates:--.

In claim 5, column 8, line 36, "$R_1/R_2$," should read --$R_1, R_2$,--.

Signed and Sealed this

Twenty-second Day of January, 2008

JON W. DUDAS
*Director of the United States Patent and Trademark Office*